(12) United States Patent
Qu et al.

(10) Patent No.: US 9,773,999 B2
(45) Date of Patent: Sep. 26, 2017

(54) ORGANIC ELECTROLUMINESCENT DISPLAY PANEL, FABRICATION METHOD THEREOF AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Litao Qu, Beijing (CN); Chuan Yin, Beijing (CN); Chia Hao Chang, Beijing (CN); Shih Lun Chen, Beijing (CN); Zhiqiang Jiang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/098,516

(22) Filed: Apr. 14, 2016

(65) Prior Publication Data
US 2016/0336536 A1 Nov. 17, 2016

(30) Foreign Application Priority Data
May 13, 2015 (CN) .......................... 2015 1 0242347

(51) Int. Cl.
*H01L 51/52* (2006.01)
*H01L 51/56* (2006.01)

(52) U.S. Cl.
CPC .......... *H01L 51/5246* (2013.01); *H01L 51/56* (2013.01)

(58) Field of Classification Search
CPC ............. H01L 51/0545; H01L 51/0036; H01L 51/0541
See application file for complete search history.

(56) References Cited

U.S. PATENT DOCUMENTS

| 7,145,290 B2 * | 12/2006 | Kang | H01L 51/524 |
| | | | 313/503 |
| 9,441,416 B2 * | 9/2016 | Veerasamy | E06B 3/6775 |

(Continued)

FOREIGN PATENT DOCUMENTS

| CN | 1622700 A | 6/2005 |
| CN | 102648543 A | 8/2012 |
| WO | 2014189221 A1 | 11/2014 |

OTHER PUBLICATIONS

May 2, 2017—(CN) First Office Action Appn 201510242347.1 with English Tran.

*Primary Examiner* — Quoc Hoang
(74) *Attorney, Agent, or Firm* — Banner & Witcoff, Ltd.

(57) ABSTRACT

An organic electroluminescent display panel, a fabrication method thereof, and a display device are provided. The organic electroluminescent display panel comprises: a base substrate and a package cover plate disposed opposite to each other, and an organic electroluminescent structure disposed on the base substrate and provided between the base substrate and the package cover plate. The package cover plate has a first groove for accommodating the organic electroluminescent structure within a display region of the organic electroluminescent display panel; the package cover plate has at least one second groove surrounding the first groove and having a closed boundary within a non-display region of the organic electroluminescent display panel; the second groove accommodates a sealant; and there is a metal layer between a protrusion portion of the package cover plate and the base substrate.

9 Claims, 6 Drawing Sheets

(56) References Cited

U.S. PATENT DOCUMENTS

2014/0087099 A1    3/2014   Veerasamy et al.
2016/0126426 A1*   5/2016   Kim ..................... H01L 33/486
                                                                                            257/98

* cited by examiner

ORGANIC ELECTROLUMINESCENT DISPLAY PANEL, FABRICATION METHOD THEREOF AND DISPLAY DEVICE

This application claims priority to and the benefit of Chinese Patent Application No. 201510242347.1 filed on May 13, 2015, which application is incorporated herein in its entirety.

TECHNICAL FIELD

Embodiments of the present disclosure relate to an organic electroluminescent display panel, a fabrication method thereof, and a display device.

BACKGROUND

Organic electroluminescent display panel gradually becomes an important display device, due to its advantages such as all-solid state, active luminescence, fast response, high contrast, low energy consumption, simple fabrication process, low cost, high luminous efficiency, suitable for flexible structure and the like.

Figure 1:
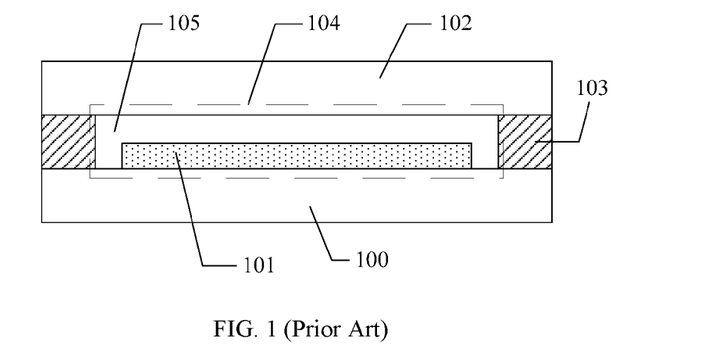
FIG. 1 is a structural schematic view of an organic electroluminescent display panel according to one technique.

As shown in FIG. 1, the organic electroluminescent display panel comprises: a base substrate 100, an organic electroluminescent structure 101 provided on the base substrate 100, and a package cover plate 102. The package cover plate 102 and the base substrate 100 are bonded with each other by a sealant 103 to form an accommodating cavity 104 for accommodating the organic electroluminescent structure 101, and a filling adhesive 105 is provided within the accommodating cavity 104 to fix the organic electroluminescent structure 101.

Because the sealant has a larger molecular gap after being cured, external water and oxygen are apt to pass through the sealant to enter the interior of the organic electroluminescent display panel, causing deterioration of the organic electroluminescent structure and reducing a service life of the organic electroluminescent display panel.

SUMMARY

According to embodiments of the disclosure, an organic electroluminescent display panel is provided. The organic electroluminescent display panel comprises: a base substrate and a package cover plate disposed opposite to each other, and an organic electroluminescent structure disposed on the base substrate and provided between the base substrate and the package cover plate. The package cover plate has a first groove for accommodating the organic electroluminescent structure within a display region of the organic electroluminescent display panel; the package cover plate has at least one second groove surrounding the first groove and having a closed boundary within a non-display region of the organic electroluminescent display panel; the second groove accommodates a sealant; and there is a metal layer between a protrusion portion of the package cover plate and the base substrate.

For example, a depth of the second groove is less than or equal to 100 µm.

For example, a depth of the first groove is less than or equal to 100 µm.

For example, a depth of the first groove is equal to a depth of the second groove.

For example, a thickness of the metal layer is within a range of 1 µm to 10 µm.

For example, a melting point of the metal layer is lower than those of the package cover plate and the base substrate.

For example, the metal layer is formed of any one or a combination of lead, zinc, tin, tin-aluminum alloy, nickel-chromium alloy and lead-antimony alloy.

According to the embodiments of the disclosure, a display device is provided. The display device comprises: the organic electroluminescent display panel as described above.

According to the embodiments of the disclosure, a fabrication method of an organic electroluminescent display panel is provided. The method comprises: forming a first groove for accommodating an organic electroluminescent structure within a display region of a package cover plate of the organic electroluminescent display panel and forming at least one second groove surrounding the first groove and having a closed boundary within a non-display region of the package cover plate of the organic electroluminescent display panel; forming a metal layer on a protrusion portion of the package cover plate; forming a sealant within the second groove of the package cover plate having the metal layer formed thereon and/or at a region of a base substrate having the organic electroluminescent structure formed thereon, which corresponds to the second groove; and bonding the package cover plate and the base substrate.

For example, before forming the sealant, the method further comprises: forming another metal layer in a region on the base substrate corresponding to the protrusion portion.

For example, the metal layer and the another metal layer are formed of a same material.

For example, the metal layer and the another metal layer are formed of any one or a combination of lead, zinc, tin, tin-aluminum alloy, nickel-chromium alloy and lead-antimony alloy.

For example, after forming the metal layer, the method further comprises: performing an annealing treatment on the metal layer.

For example, the bonding the package cover plate and the base substrate includes: contacting the package cover plate with the base substrate, and performing a pressurizing treatment; and performing a curing treatment on the sealant between the package cover plate and the base substrate after the package cover plate contacts the base substrate and the pressurizing treatment is performed.

For example, after the contacting the package cover plate with the base substrate and before the performing the pressurizing treatment on the package cover plate and the base substrate, the method further comprises: performing a laser melting treatment on the metal layer.

For example, the method further comprises: performing a cooling treatment on the metal layer.

For example, the metal layer is formed of any one or a combination of lead, zinc, tin, tin-aluminum alloy, nickel-chromium alloy and lead-antimony alloy.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

The shapes and the thicknesses of respective layers shown in the accompanying drawings are merely illustrative of embodiments of the present disclosure, but are not intended to reflect real scales.

Figure 2:
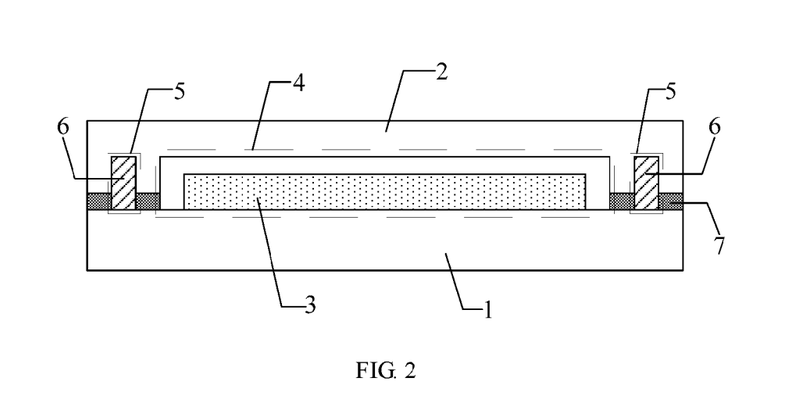
FIG. 2 is a structural schematic view of an organic electroluminescent display panel according to embodiments of the present disclosure.

Embodiments of the present disclosure provide an organic electroluminescent display panel, as shown in FIG. 2, comprising: a base substrate 1 and a package cover plate 2 disposed opposite to each other, and an organic electroluminescent structure 3 disposed on the base substrate 1 and provided between the base substrate 1 and the package cover plate 2.

The package cover plate 2 has a first groove 4 for accommodating the organic electroluminescent structure 3 within a display region of the organic electroluminescent display panel; the package cover plate 2 has at least one second groove 5 (FIG. 2 shows one second groove as an example) surrounding the first groove 4 and having a closed boundary within a non-display region of the organic electroluminescent display panel; the second groove 5 accommodates a sealant 6; and there is a metal layer 7 between a protrusion portion of the package cover plate 2 and the base substrate 1.

In the above-described organic electroluminescent display panel according to the embodiments of the present disclosure, the protrusion portion of the package cover plate and the base substrate are bonded by using the metal layer; since a molecular density of the protrusion portion of the package cover plate and a molecular density of the metal layer provided between the protrusion portion and the base substrate is great, an effect of high-efficiently blocking external water and oxygen is achieved; besides, the sealant is accommodated within the second groove, and the package cover plate and the base substrate are bonded by using the metal layer in combination with the sealant, a seal performance of the organic electroluminescent display panel is effectively enhanced under the premise that an adhesion property of the base substrate and the package cover plate is ensured; in addition, the metal layer is formed between the protrusion portion of the package cover plate and the base substrate, which reduces a thickness of the metal layer, and further reduces a degree of difficulty in evaporating the metal layer to save a fabrication cost.

For example, the protrusion portion of the package cover plate 2 is provided in the non-display region of the organic electroluminescent display panel.

It should be noted that, in the above-described organic electroluminescent display panel according to the embodiments of the present disclosure, in the case that the package cover plate is provided with one second groove, the protrusion portion of the package cover plate comprises a protrusion provided between the first groove and the second groove and a protrusion provided outside the second groove; in the case that the package cover plate is provided with a plurality of second grooves, the protrusion portion of the package cover plate comprises a protrusion provided between the first groove and an innermost second groove, protrusions provided between adjacent second grooves, and a protrusion provided outside an outermost second groove.

It should be noted that, the organic electroluminescent structure in the above-described organic electroluminescent display panel according to the embodiments of the present disclosure is similar with the organic electroluminescent structure in the existing organic electroluminescent display panel, which includes an anode, a light-emitting layer and a cathode stacked sequentially on the base substrate, and details thereof will not be repeated here.

It should be noted that, in the above-described organic electroluminescent display panel according to the embodiments of the present disclosure, the first groove accommodates the organic electroluminescent structure, and further accommodates a filling adhesive for fixing the organic electroluminescent structure. The filling adhesive is similar to an existing filling adhesive, which will not be repeated here.

For example, in the above-described organic electroluminescent display panel according to the embodiments of the present disclosure, as shown in FIG. 2, a depth of the second groove 5 is controlled in a range of less than or equal to 100 μm, and thus, an effect on a strength of the base substrate 1 and the package cover plate 2 due to existence of the second groove 5 is reduced. Depending on practical requirements, the depth of the second groove 5 may be adjusted according to a thickness of the base substrate 1 and a thickness of the package cover plate 2.

For example, in the above-described organic electroluminescent display panel according to the embodiments of the present disclosure, as shown in FIG. 2, a depth of the first groove 4 is controlled in a range of less than or equal to 100 μm, and thus, an effect on the strength of the base substrate 1 and the package cover plate 2 due to existence of the first groove 4 is reduced. Depending on practical requirements, the depth of the first groove 4 may be adjusted according to the thickness of the base substrate 1, the thickness of the package cover plate 2 and a thickness of the organic electroluminescent structure 3.

Further, in the above-described organic electroluminescent display panel according to the embodiments of the present disclosure, as shown in FIG. 2, the depth of the first groove 4 and the depth of the second groove 5 is set to be equal, and thus, a fabrication process of the organic electroluminescent display panel is simplified, for example, the first groove 4 and the second groove 5 are formed simultaneously by a same patterning process.

For example, in above-described organic electroluminescent display panel according to the embodiments of the present disclosure, the metal layer is formed by a evaporation method; it is not only time-consuming but also material-wasting in the case that the metal layer is evaporated to have an excessively large thickness, and a poor adhesion property between the metal layer and the base substrate is caused in the case that the metal layer is evaporated to have an excessively small thickness. Therefore, in comprehensive consideration of the above-described factors, it is necessary to appropriately select a thickness of the metal layer, and the thickness of the metal layer of example is controlled within a range of 1 μm to 10 μm.

For example, in the above-described organic electroluminescent display panel according to the embodiments of the present disclosure, as shown in FIG. 2, the protrusion portion of the package cover plate 2 and the base substrate 1 are bonded by the metal layer 7, and specifically, the metal layer 7 is formed on the protrusion portion of the package cover plate 2, and the metal layer 7 and the base substrate 1 are bonded by pressurizing the package cover plate 2 and the base substrate 1. For example, in order to improve the adhesion property between the metal layer 7 and the base substrate 1, the metal layer 7 is heated by using laser radiation before pressurizing the package cover plate 2 and the base substrate 1, so that a surface of the metal layer 7 has a temperature exceeding a critical temperature of the metal layer 7 and enters into a molten state. On such basis, in order to prevent an excessively high temperature from damaging the package cover plate 2 and the base substrate 1 during the laser radiation process, a material having a melting point lower than those of the package cover plate 2 and the base substrate 1 for example is selected as a material of the metal layer 7.

For example, in the above-described organic electroluminescent display panel according to the embodiments of the present disclosure, a material of the package cover plate and the base substrate is glass. Because melting points of lead, zinc, tin, tin-aluminum alloy, nickel-chromium alloy and lead-antimony alloy are lower than a melting point of glass, the material of the metal layer for example is any one or a combination of lead, zinc, tin, tin-aluminum alloy, nickel-chromium alloy and lead-antimony alloy. In addition, resistivities of lead, zinc, tin, tin-aluminum alloy, nickel-chromium alloy and lead-antimony alloy are higher. According to a light absorption rate equation $A=0.1457Q/K$ (where A is a light absorption rate, Q is a resistivity, and K is a wavelength of incident light), it can be known that, in a case where the wavelength of the incident light K is given, the higher the resistivity Q of the metal layer is, the greater the light absorption rate A of the metal layer is, and the less the reflectivity of the metal layer for the laser is, so that a negative effect generated due to reflection of the laser by the metal layer is reduced, and a utilization rate of the laser is improved.

Of course, in the above-described organic electroluminescent display panel according to the embodiments of the present disclosure, the material of the metal layer is not limited to lead, zinc, tin, tin-aluminum alloy, nickel-chromium alloy and lead-antimony alloy, and it may be other metal material having a low melting point and a high resistivity, which will not be limited here.

The embodiments of the present disclosure further provide a display device, comprising: the above-described organic electroluminescent display panel according to the embodiments of the present disclosure. The display device may be: any product or component having a display function, such as a mobile phone, a tablet computer, a television, a monitor, a laptop computer, a digital photo frame, a navigator, etc. The embodiments of the above-described organic electroluminescent display panel may be referred to for implementation of the display device, and repeated parts will not be illustrated here.

Figure 3:
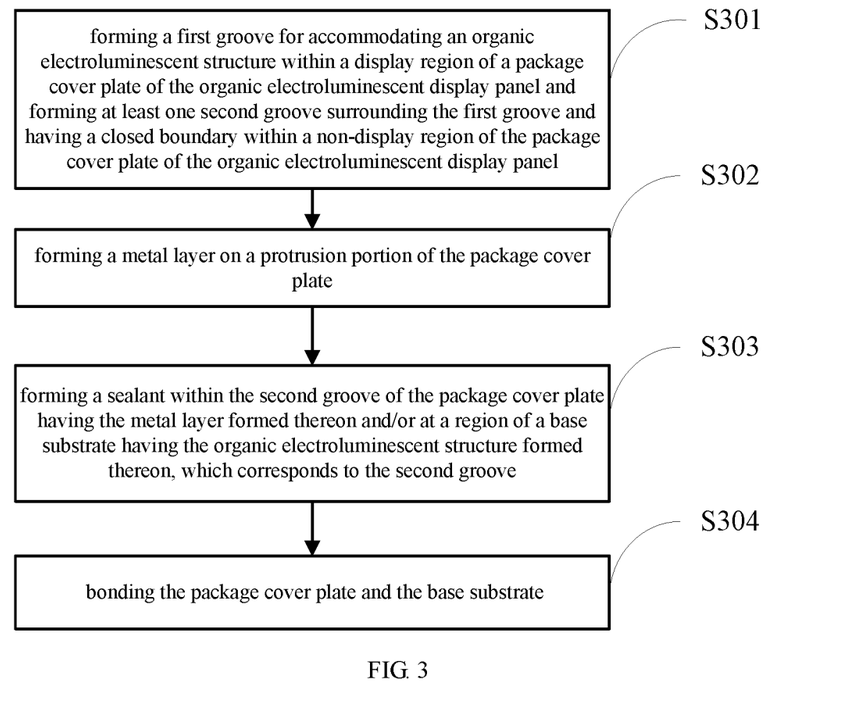
FIG. 3 and FIG. 4 are respectively flow charts of a fabrication method of an organic electroluminescent display panel according to the embodiments of the present disclosure.

The embodiments of the present disclosure further provide a fabrication method of an organic electroluminescent display panel, as shown in FIG. 3, comprising steps of:

S301: forming a first groove for accommodating an organic electroluminescent structure within a display region of a package cover plate of the organic electroluminescent display panel and forming at least one second groove surrounding the first groove and having a closed boundary within a non-display region of the package cover plate of the organic electroluminescent display panel;

S302: forming a metal layer on a protrusion portion of the package cover plate;

S303: forming a sealant within the second groove of the package cover plate having the metal layer formed thereon and/or at a region of a base substrate having the organic electroluminescent structure formed thereon, which corresponds to the second groove;

S304: bonding the package cover plate and the base substrate.

For example, the sealant is formed by a coating method.

Figure 4:
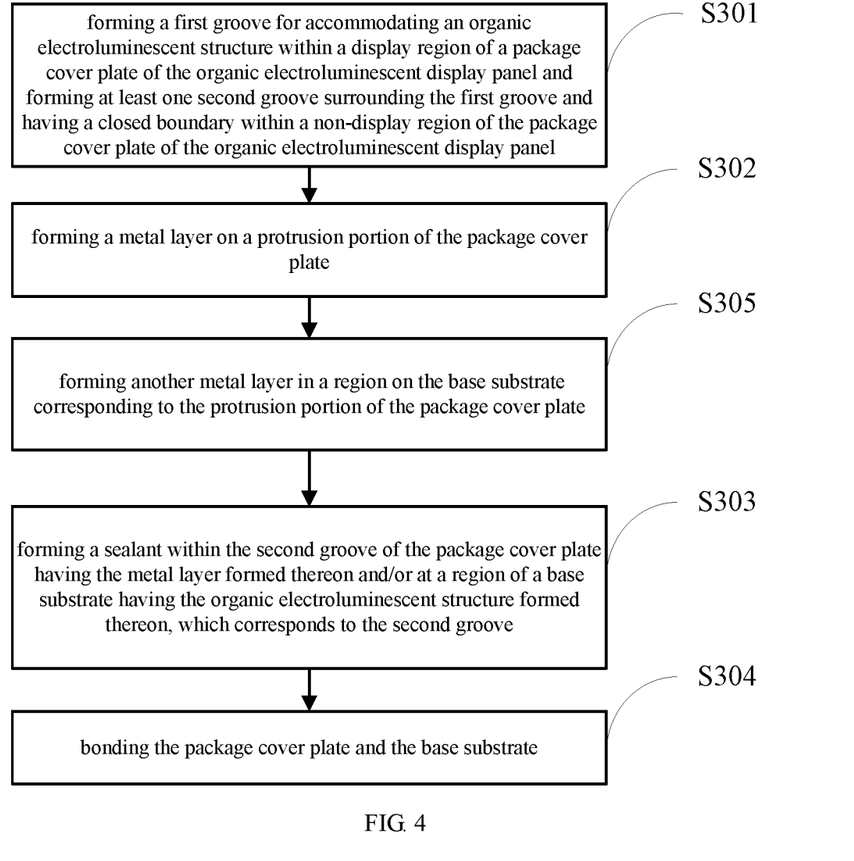

For example, as shown in FIG. 4, before performing step S303 of forming the sealant, the above-described method according to the embodiments of the present disclosure, may further comprises a step of:

S305: forming another metal layer in a region on the base substrate corresponding to the protrusion portion of the package cover plate. In this way, both a thickness of the metal layer formed on the package cover plate and a thickness of another metal layer formed on the base substrate are reduced by half, so as to further reduce a degree of difficulty in evaporating the metal layer, and simplify the fabrication process of the organic electroluminescent display panel.

It should be noted that, in the above-described method according to the embodiments of the present disclosure, there is no sequential order for executing the step S305 of forming another metal layer in the region on the base substrate corresponding to the protrusion portion and the step S301 of forming the first groove and the second groove in the package cover plate; for example, the step S305 and the step S301 are executed simultaneously. It should be noted that, there is no sequential order for executing the step S305 of forming another metal layer in the region on the base substrate corresponding to the protrusion portion and the step S302 of forming the metal layer on the protrusion portion of the package cover plate. For example, the step S305 and the step S302 are executed simultaneously; in this case, it is necessary to ensure that the step S302 is executed after the step S301. Moreover, the step S303 is executed in following modes: the sealant is formed within the second groove of the package cover plate having the metal layer formed thereon; and/or the sealant is formed in the region of the base substrate having the organic electroluminescent structure formed thereon, which corresponds to the second groove, which will not be limited here.

For example, after the step S302 of forming the metal layer on the protrusion portion of the package cover plate and the step S305 of forming another metal layer in the region on the base substrate corresponding to the protrusion portion, the method according to the embodiments of the present disclosure further comprises: annealing the metal layer and the another metal layer. In this way, stress of the metal layers are reduced, so that evenness of the metal layer are improved to further optimize the seal effect.

For example, the step S304 of bonding the package cover plate and the base substrate in the above-described method according to the embodiments of the present disclosure is implemented in a mode as follows:

Firstly, the package cover plate contacts the base substrate, and a pressurizing treatment is performed on the package cover plate and the base substrate;

Then, a curing treatment is performed on the sealant between the package cover plate and the base substrate after the package cover plate contacts the base substrate and the pressurizing treatment is performed. The sealant for example is a sealant of photo-curing type, then it is necessary to perform a light treatment on the sealant; or, the sealant for example is a sealant of thermo-curing type, then it is necessary to perform a heat treatment on the sealant, which will not be limited here.

For example, in the above-described method according to the embodiments of the present disclosure, after the package cover plate contacts the base substrate and before the pressurizing treatment is performed on the package cover plate and the base substrate, a laser melting treatment for example is performed on the metal layer, that is, the metal layer is heated by laser radiation, so that the surface of the metal layer has a temperature exceeding the critical temperature of the metal layer and enters into the molten state. In this way, the adhesion property between the metal layer on the package cover plate and the base substrate, or the adhesion property between the metal layer on the package cover plate and the metal layer on the base substrate are improved.

For example, in the above-described method according to the embodiments of the present disclosure, since the metal layer enters into the molten state in the case that the metal layer is heated by laser radiation, it is necessary to perform a cooling treatment on the metal layer after or before the curing treatment is performed on the sealant, so that the metal layer in the molten state is cured to ensure a packaging performance of the organic electroluminescent display panel.

Hereinafter, the above-described fabrication method of the organic electroluminescent display panel according to the embodiments of the present disclosure will be described in detail with two examples.

Figure 5A:
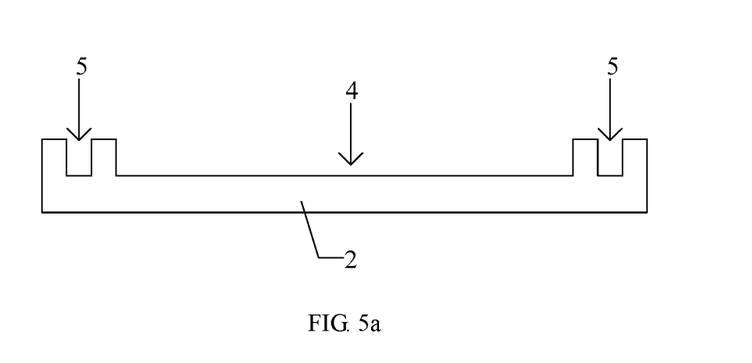
FIG. 5a to FIG. 5d are respectively structural schematic views of the fabrication method of the organic electroluminescent display panel in Example One according to the embodiments of the present disclosure.
Figure 5B:
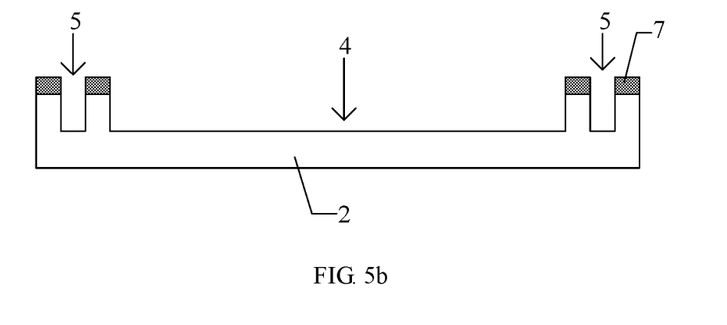
Figure 5C:
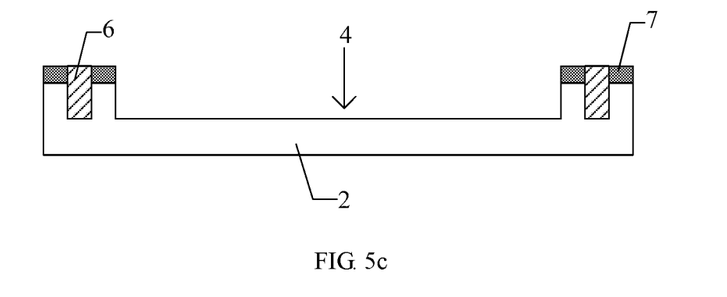
Figure 5D:
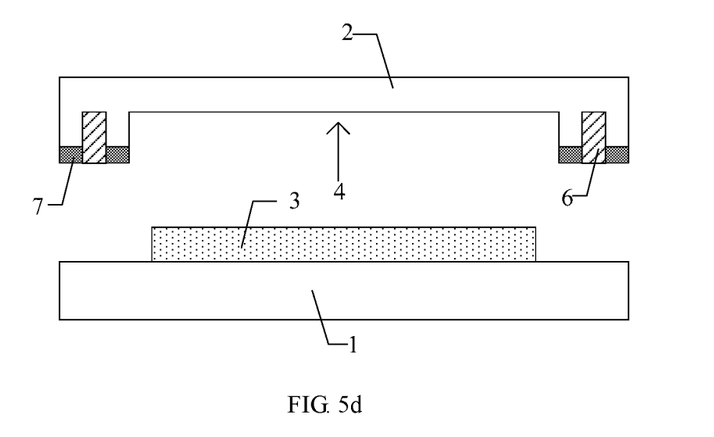

Example One: as shown in FIG. 5a to FIG. 5c, the fabrication method of the organic electroluminescent display panel of FIG. 2 comprises steps of:

1. Forming the first groove 4 for accommodating the organic electroluminescent structure within the display region of the package cover plate 2 and forming the second groove 5 surrounding the first groove 4 and having the closed boundary within the non-display region of the package cover plate 2, as shown in FIG. 5a;

2. Forming the metal layer 7 on the protrusion portion of the package cover plate 2 having the first groove 4 and the second groove 5 formed thereon, as shown in FIG. 5b;

3. Forming the sealant 6 within the second groove 5 of the package cover plate 2 having the metal layer 7 formed thereon, as shown in FIG. 5c;

4. Contacting the package cover plate having the sealant formed thereon with the base substrate having the organic electroluminescent structure formed thereon, the organic electroluminescent structure on the base substrate being accommodated within the first groove of the package cover plate; as shown in FIG. 5d, the package cover plate 2 and the base substrate 1 are to contact each other;

5. Heating the metal layer between the package cover plate and the base substrate by laser radiation;

6. Performing the pressurizing treatment on the package cover plate and the base substrate;

7. Performing the curing treatment on the sealant, and performing the cooling treatment on the metal layer, to bond the package cover plate and base substrate to obtain the organic electroluminescent display panel as shown in FIG. 2.

Figure 6A:
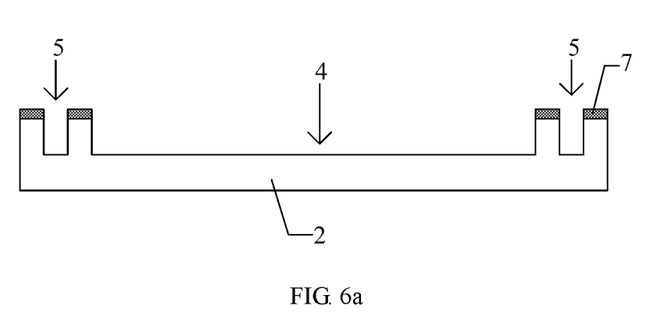
FIG. 6a to FIG. 6d are respectively structural schematic views of the fabrication method of the organic electroluminescent display panel in Example Two according to the embodiments of the present disclosure.
Figure 6B:
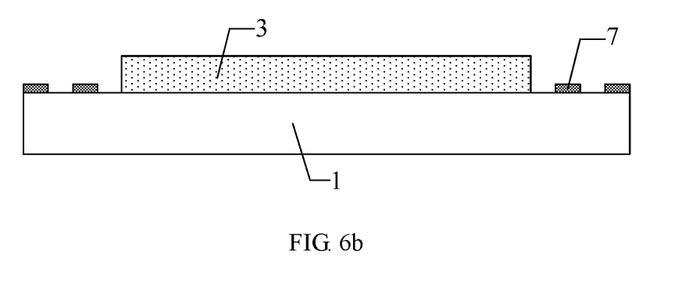
Figure 6C:
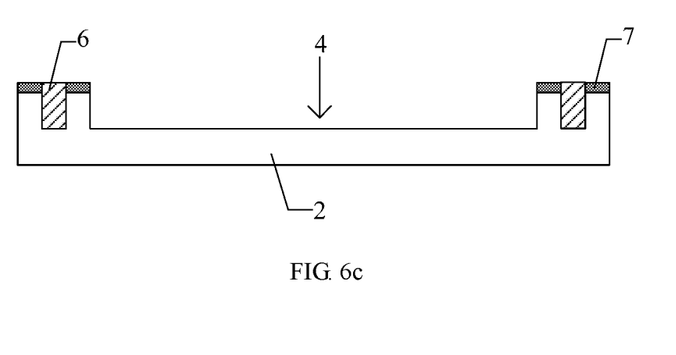
Figure 6D:
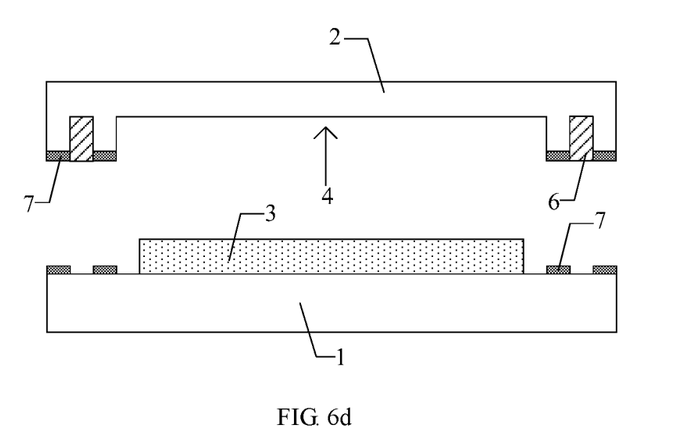

Example Two: as shown in FIGS. 5a, and 6a to 6c, the fabrication method of the organic electroluminescent display panel shown in FIG. 2 comprises steps of:

1. Forming the first groove 4 for accommodating the organic electroluminescent structure within the display region of the package cover plate 2 and forming the second groove 5 surrounding the first groove 4 and having the closed boundary within the non-display region of the package cover plate 2, as shown in FIG. 5a;

2. Forming the metal layer 7 on the protrusion portion of the package cover plate 2 having the first groove 4 and the second groove 5 formed thereon, as shown in FIG. 6a;

3. Forming the metal layer 7 in the region on the base substrate 1 having the organic electroluminescent structure 3 formed thereon, which corresponds to the protrusion portion, as shown in FIG. 6b;

4. Forming the sealant 6 within the second groove 5 of the package cover plate 2 having the metal layer 7 formed thereon, as shown in FIG. 6c;

5. Contacting the package cover plate having the sealant coated thereon with the base substrate having the metal layer formed thereon, the organic electroluminescent structure on the base substrate being accommodated within the first groove of the package cover plate; as shown in FIG. 6d, the package cover plate 2 and the base substrate 1 are to contact each other;

6. Heating the metal layer between the package cover plate and the base substrate by laser radiation;

7. Performing the pressurizing treatment on the package cover plate and the base substrate;

8. Performing the curing treatment on the sealant, and performing the cooling treatment on the metal layer, to bond the package cover plate and base substrate to obtain the organic electroluminescent display panel as shown in FIG. 2.

The organic electroluminescent display panel, the fabrication method thereof, and the display device are provided according to the embodiments of the present disclosure. In the organic electroluminescent display panel, the package cover plate has the first groove for accommodating the organic electroluminescent structure within the display region, the package cover plate has at least one second groove surrounding the first groove and having the closed boundary within the non-display region; the protrusion portion of the package cover plate and the base substrate are bonded by using the metal layer. Since a molecular density of the protrusion portion of the package cover plate and a molecular density of the metal layer provided between the protrusion portion and the base substrate is great, an effect of high-efficiently blocking external water and oxygen is achieved; besides, the sealant is accommodated within the second groove, and the package cover plate and the base substrate are bonded by using the metal layer in combination with the sealant, a seal performance of the organic electroluminescent display panel is effectively enhanced under the premise that an adhesion property of the base substrate and the package cover plate is ensured; in addition, the metal layer is formed between the protrusion portion of the package cover plate and the base substrate, which reduces a thickness of the metal layer, and further reduces a degree of difficulty in evaporating the metal layer to save a fabrication cost.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201510242347.1 filed on May 13, 2015, the disclosure of which is incorporated herein by reference in its entirety as part of the present application.

The invention claimed is:

1. A fabrication method of an organic electroluminescent display panel, comprising:
 forming a first groove for accommodating an organic electroluminescent structure within a display region of a package cover plate of the organic electroluminescent display panel and forming at least one second groove surrounding the first groove and having a closed boundary within a non-display region of the package cover plate of the organic electroluminescent display panel;
 forming a metal layer on a protrusion portion of the package cover plate;
 forming a curable sealant within the second groove of the package cover plate having the metal layer formed thereon and/or at a region of a base substrate having the organic electroluminescent structure formed thereon, which corresponds to the second groove; and
 bonding the package cover plate and the base substrate.

2. The method according to claim 1, wherein, before forming the curable sealant, the method further comprises:
 forming another metal layer in a region on the base substrate corresponding to the protrusion portion.

3. The method according to claim 2, wherein, the metal layer and the another metal layer are formed of a same material.

4. The method according to claim 3, wherein, the metal layer and the another metal layer are formed of any one or a combination of lead, zinc, tin, tin-aluminum alloy, nickel-chromium alloy and lead-antimony alloy.

5. The method according to claim 1, wherein, after forming the metal layer, the method further comprises:
 performing an annealing treatment on the metal layer.

6. The method according to claim 1, wherein, the bonding the package cover plate and the base substrate includes:
 contacting the package cover plate with the base substrate, and performing a pressurizing treatment; and
 performing a curing treatment on the curable sealant between the package cover plate and the base substrate after the package cover plate contacts the base substrate and the pressurizing treatment is performed.

7. The method according to claim 6, wherein, after the contacting the package cover plate with the base substrate and before the performing the pressurizing treatment on the package cover plate and the base substrate, the method further comprises:
 performing a laser melting treatment on the metal layer.

8. The method according to claim 7, further comprising:
 performing a cooling treatment on the metal layer.

9. The method according to claim 1, wherein, the metal layer is formed of any one or a combination of lead, zinc, tin, tin-aluminum alloy, nickel-chromium alloy and lead-antimony alloy.

* * * * *